(12) United States Patent
Kauppinen et al.

(10) Patent No.: US 8,168,892 B2
(45) Date of Patent: May 1, 2012

(54) SOLDERMASK-LESS PRINTED WIRING BOARD

(75) Inventors: Esa H. Kauppinen, Jyvaskyla (FI); Ian R. Timms, Camberley (GB)

(73) Assignee: Nokia Corporation, Espoo (FI)

( * ) Notice: Subject to any disclaimer, the term of this patent is extended or adjusted under 35 U.S.C. 154(b) by 311 days.

(21) Appl. No.: 12/380,091

(22) Filed: Feb. 23, 2009

(65) Prior Publication Data

US 2010/0212940 A1    Aug. 26, 2010

(51) Int. Cl.
*H05K 1/00*    (2006.01)
(52) U.S. Cl. .......................................... 174/258; 174/257
(58) Field of Classification Search ................. 174/257, 174/250, 261, 263, 258; 29/829
See application file for complete search history.

(56) References Cited

U.S. PATENT DOCUMENTS

| | | | | |
|---|---|---|---|---|
| 5,061,830 A | * | 10/1991 | Ambrose | 200/5 A |
| 6,519,161 B1 | * | 2/2003 | Green | 174/394 |
| 2005/0150683 A1 | * | 7/2005 | Farnworth et al. | 174/255 |
| 2006/0180343 A1 | * | 8/2006 | Chan et al. | 174/256 |
| 2007/0205114 A1 | * | 9/2007 | Mathur | 205/792 |
| 2009/0120677 A1 | * | 5/2009 | Nomura et al. | 174/262 |

OTHER PUBLICATIONS

"Coates Carbon Inks for PCB Applications", R. Smith, Jul. 2001, 6 pgs.

* cited by examiner

*Primary Examiner* — Yuriy Semenenko
(74) *Attorney, Agent, or Firm* — Harrington & Smith (57) ABSTRACT

A printed wiring board has a non-conducting substrate with first and second major outboard surfaces; printed electrical conductors over at least the first major outboard surface; and an electrically insulating coating selectively disposed over the printed electrical conductors such that the coating forms an outermost layer over the first major outboard surface. In various embodiments, the coating is screen printed dielectric carbon ink which is also disposed over keypads on the second major outboard surface. There is no need for a soldermask layer as the keypads and electrical conductors are protected by the carbon ink from oxidation due to humidity and from shorting against other components. A method for making the PWB is also detailed.

20 Claims, 10 Drawing Sheets

SOLDERMASK-LESS PRINTED WIRING BOARD

TECHNICAL FIELD

The exemplary and non-limiting embodiments of this invention relate generally to printed wiring boards and their fabrication, and, more specifically, relate to corrosion protection of conductive portions of such a printed wiring board.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

The printed wiring board (PWB) is the foundation for virtually all electronics. The PWB is the platform upon which electronic components such as integrated circuit chips and discrete passive components are mounted. The PWB, sometimes referred to as a printed circuit board (PCB), provides the physical structure for mounting and holding electronic components as well as the electrical interconnection between components. A PWB includes a non-conducting substrate (typically fiberglass, epoxy, and/or polyamide) upon which a conductive pattern or circuitry is formed. Copper is the most prevalent conductor, although nickel, silver, tin, tin-lead, and gold may also be used as etch-resists or top-level metal. There are three types of PWBs: single-sided, double-sided, and multilayer. Single-sided PWBs have a conductive pattern on one side only, double-sided boards have conductive patterns on both sides (top and bottom), and multilayer boards contain two or more double-sided PWBs that are bonded together. The conductive pathways or traces and other features are connected by plated through-holes or vias, which are also used to mount and electrically connect components. PWBs may be rigid, flexible or flexi-rigid.

A variety of processes have been used for forming the conductive pathways on the non-conductive substrate of PWBs. For example, a metal film such as copper can be applied to the non-conductive substrate of the PWB. In a common process, a sheet of the conductive metal is laminated to the non-conductive substrate and a photoresist is then coated on the metal sheet. The resulting PWB is then exposed to a pattern of light employing a light mask to reproduce the metal pathway pattern desired. This exposure is followed by photoresist development and then metal etching in the areas unprotected by the photoresist, in order to produce the desired circuit pattern. In the alternative, an etch resist can be directly printed such as by silk screen on the metal laminate sheet followed by curing and then metal etching. This multi-step process is time-consuming and relatively expensive.

A soldermask, also termed solder resist, is a permanent coating of a resin formulation, typically translucent green in color, which encapsulates and protects all of the surface features of a PWB except the specific areas where it is required to form solder joints. The soldermask is applied to prevent wetting by molten solder and/or liquid solder paste from migrating beyond the desired contact pads during manufacture. The soldermask is spread across the surface of the PWB and so it also provides electrical insulation of the various circuit traces which lie beneath it to prevent them from shorting to one another. The soldermask also prevents the conductors underneath it from shorting with other conductors that may come into contact with the outer surface of the PWB. For the finished PWB the soldermask layer additionally provides long-term protection against oxidation and corrosion of the conductive traces. Historically soldermask has also been used in wave soldering.

Relevant background teachings may be seen in a paper entitled COATES CARBON INKS FOR PCB APPLICATIONS, by R. Smith (July 2001). The color view of that reference shows a translucent green overcoat to the PWB which conventionally represents a soldermask.

SUMMARY

In accordance with an exemplary and non-limiting embodiment of the invention there is an apparatus that comprises a non-conducting substrate having a first major outboard surface and an opposed second major outboard surface; printed electrical conductors over at least the first major outboard surface; and an electrically insulating coating selectively disposed over the printed electrical conductors such that the coating forms an outermost layer over the first major outboard surface. That it is an outermost layer excludes prior art apparatuses which are in an interim fabrication stage and which have another layer such as a soldermask layer disposed over a similar selectively printed coating.

In accordance with another exemplary and non-limiting embodiment of the invention there is an apparatus that comprises a non-conducting substrate having a first major outboard surface and an opposed second major outboard surface; a plurality of conductive means disposed over at least the first major outboard surface; and electrically insulating means selectively disposed over the conductive means such that the coating forms an outermost layer over the first major outboard surface. In a particular embodiment the plurality of conductive means comprises a plurality of printed copper traces, and the electrically insulating means comprises printed dielectric carbon ink.

In accordance with still another exemplary and non-limiting embodiment of the invention there is provided a method that comprises providing a printed wiring board which comprises a non-conducting substrate having a first major outboard surface and an opposed second major outboard surface and printed electrical conductors on at least the first major outboard surface. Further in the method, an electrically insulating coating is selectively disposed over the printed electrical conductors which lie on the at least the first major outboard surface; and thereafter the printed wiring board is provided for assembly in an electrical device in which the printed electrically insulating coating is an outermost layer on portions of the first major outboard surface on which the coating was selectively printed.

DETAILED DESCRIPTION

Figure 1:
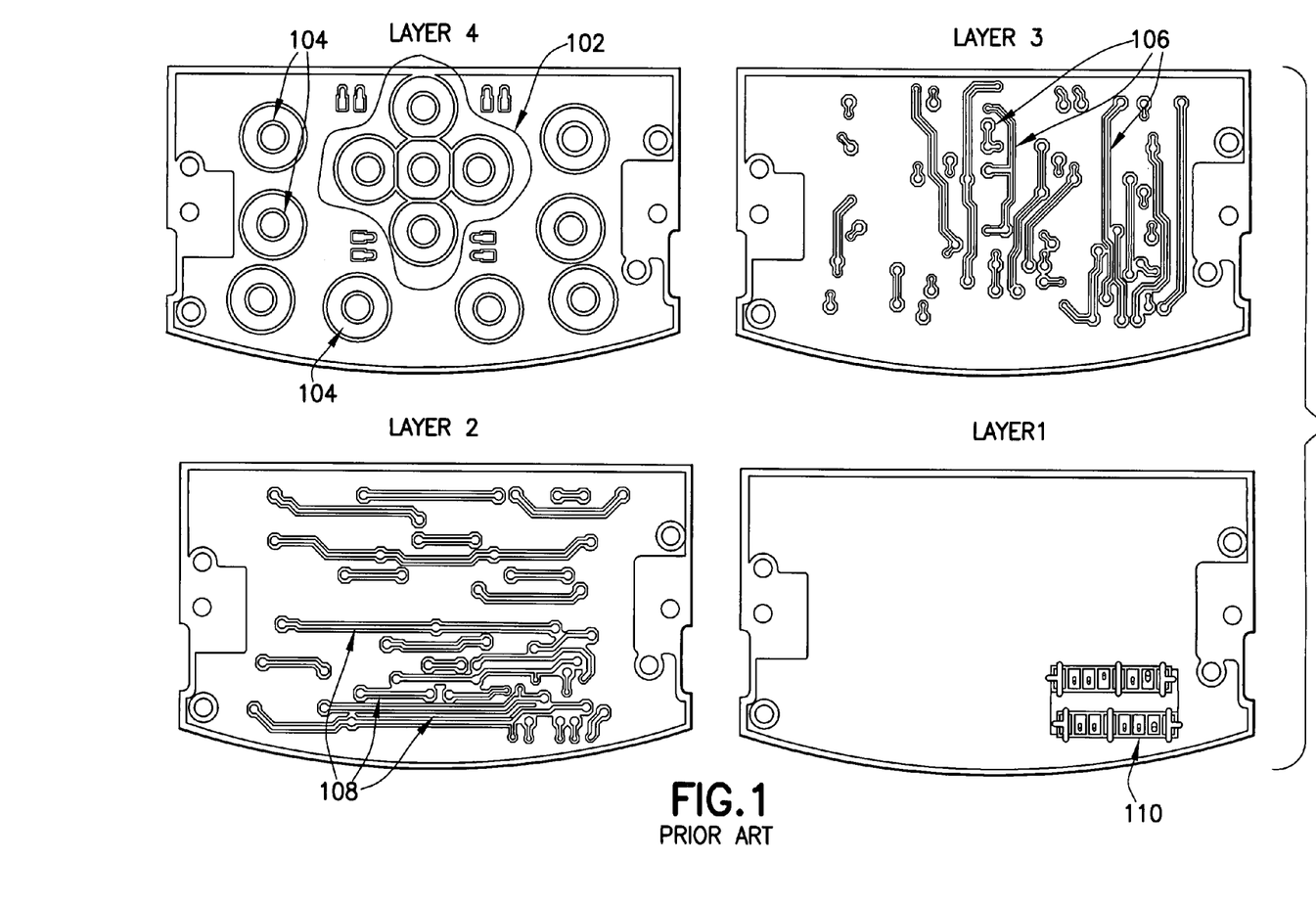
FIG. 1 is a plan view of each of four layers of a prior art printed wiring board having soldermask layers on its outboard major surfaces.

FIG. 1 is a plan view of each of four layers of one particular prior art PWB, in which layers 1 and 4 may be considered outboard layers and layers 2 and 3 may be considered interim layers sandwiched between those outboard layers 1 and 4. Each of the layers detailed herein are major surfaces of the PWB; the edge surfaces are not generally used for conductive purposes. Layer 4 illustrates a cluster 102 of five keypads which interface to a navigation/selector button sometimes referred to as a joystick which a user operates to move a cursor across a graphical display interface in left, right, up and down directions. The center keypad of the cluster 102 is used to select an area/hyperlink over which the cursor lies. Additional keypads 104 are also shown, which may be implemented as dedicated keys or soft (multi-function) keys for entering other user actions.

Circuitry at layer 3 of FIG. 1 includes conductive traces 106 which generally span a vertical direction. One terminal end of each conductive trace 106 electrically connects to one of the keypads 102, 104 on layer 4 through a conductive via through an insulating layer, while the opposed end of those conductive traces 106 electrically connect to a terminal end of a conductive trace 108 lying in layer 2 of FIG. 1, also through a conductive via which penetrates an insulating layer. It is seen that the conductive traces 108 within layer 2 of FIG. 1 generally span a horizontal direction. Opposed ends of those conductive traces 108 terminate at a keypad array 110 shown at layer 4. All user inputs made at the keypads 102, 104 are interfaced electrically to this keypad array 110 using the various traces 106, 108 within the intervening layers 2 and 3. The keypad array 110 is then electrically connected to further circuitry (e.g., a user input chip or a general processor) for processing those user input signals.

Typically during manufacture, the outboard surfaces of the PWB of FIG. 1, which is shown as layers 1 and 4, would be fully coated with a soldermask layer, with the possible exception of the keypads 102, 104, to protect the keypad array 110 and other coated surfaces over time from environmental degradation of the circuitry and from shorting of exposed conductors. Shorting is not a negligible concern because often a conductive material (e.g., copper) is used to 'fill' the outboard surfaces between dielectric insulating materials for outboard surface smoothness. Because molten copper is less viscous than uncured resin soldermask, the added surface smoothness enables a thinner layer for the soldermask overlayer. Electrical penetrations through the soldermask are typically made as solder pads, such as for coupling the keypad array 110 to additional traces (not shown) that electrically couple to pins of a user interface chip (not shown).

While less complex than forming a processor, the manufacturing of PWBs include similarly multi-layer and multi-step processes. After the interim layers 2 and 3 are made the keypads 102, 104 and the keypad array 110 is made on the outboard surfaces (layers 1 and 4) of the PWB, and the surface of layer 4 adjacent to the keypads 102, 104 as well as the entire surface of layer 4, including the keypad array 110, are then coated with soldermask layers and solder pads are made to connect through holes in the soldermask to the underlying circuitry (e.g., at the keypad array). There are cost savings if certain processing steps may be eliminated, such as eliminating the soldermask layer itself.

Figure 2:
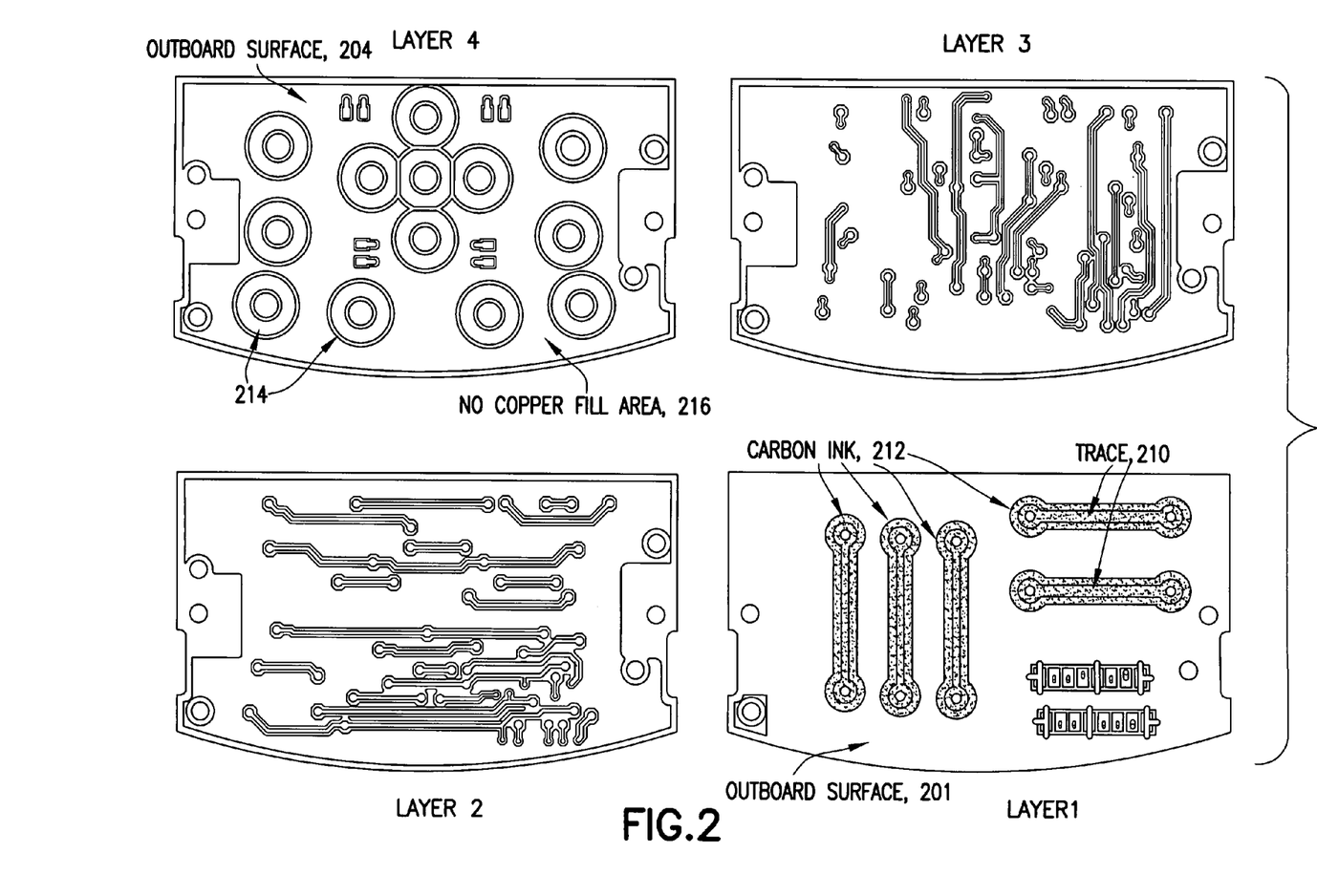
FIG. 2 is a plan view of a PWB similar to that of FIG. 1 but showing a selectively printed carbon ink coating instead of a soldermask layer according to an exemplary embodiment of the invention.

According to exemplary embodiments of this invention and with reference to FIG. 2, a PWB (shown in four layers there similar in layout as FIG. 1) is characterized by the absence of a soldermask on its outboard surface(s) 201, 204. Long term protection for the circuit traces 210 which lie along the outboard surfaces is provided by a printed coating 212 which is both electrically insulating and durable. A 'printed coating' is applied selectively over insulators rather than across an entire major surface (or across large portions of the surface without regard to underlying conductors). For example, screen printing and lithographic printing are printing processes for purposes of a durable electrically insulating coating. One particular example of such an electrically insulating durable coating is carbon ink, which is both dielectric and readily adaptable for screen printing processes.

Cost savings arise by eliminating the soldermask layer on both layer 1 (201) and layer 4 (204) in the specific example of FIG. 2. The carbon ink 212 is screen printed to overlie the electrically conductive traces 210 which lie on the major outboard surfaces 201, 204. The keypads 214 on layer 4 (204) of FIG. 2 are also selectively coated with a carbon ink. Since the interlayers (layers 2 and 3) are sometimes made with a printed insulator over the traces 106, 108, there is no additional processing equipment necessary to print a carbon ink over conductive areas 210 which lie on the outboard surfaces 201, 204. While the keypads 214 may or may not be conductive themselves (typically they are not; depressing an individual keypad makes an electrical contact in an interim layer such as layer 3), the durable nature of the printed carbon ink provides the requisite environmental protection. Since other areas of the outboard surfaces (layers 1 and 4) are less subject to degradation over time little is lost by not coating those areas with a protective overlayer. In an embodiment of the invention an outboard surface of the PWB is characterized also by a lack of electrical fill material in those other areas 216.

In other embodiments, there may be a carbon ink coating across an entire outboard surface of the PWB, such as for example across the entire outboard surface 204 in which there are no electrically conductive elements directly under the carbon ink layer. In FIG. 2 the keypads 214 are not conductive on that surface 204 and so in some PWB layouts it may be more economical to coat the entire outboard surface with a carbon ink rather than selectively coat those areas in need of durable protection. Such PWBs are characterized in that one outboard surface is coated with carbon ink and the opposed outboard surface has carbon ink 214 selectively printed over the electrically conductive traces 210.

In either case, selective printing or an outer coating across an entire outboard surface, the carbon ink protects the copper traces 210 from oxidizing or corroding, and the carbon ink also protects the keypad structure from degradation due to rubbing directly against the underside of the user interface key which the user actually depresses. The carbon ink is generally more resilient to such rubbing than the membrane of the actual underlying keypad 214 itself.

Exemplary embodiments of this invention also avoids solder loss to the component pad, which can short areas of the PWB. Since there is no soldermask, there is no need to use solder pads to penetrate the solder mask and thus the risk of molten solder leakage which might short a component via contacting another trace is avoided. The traces 210 can instead penetrate to the inter-layers 2 and 3 without terminating at a solder pad.

Figure 3:
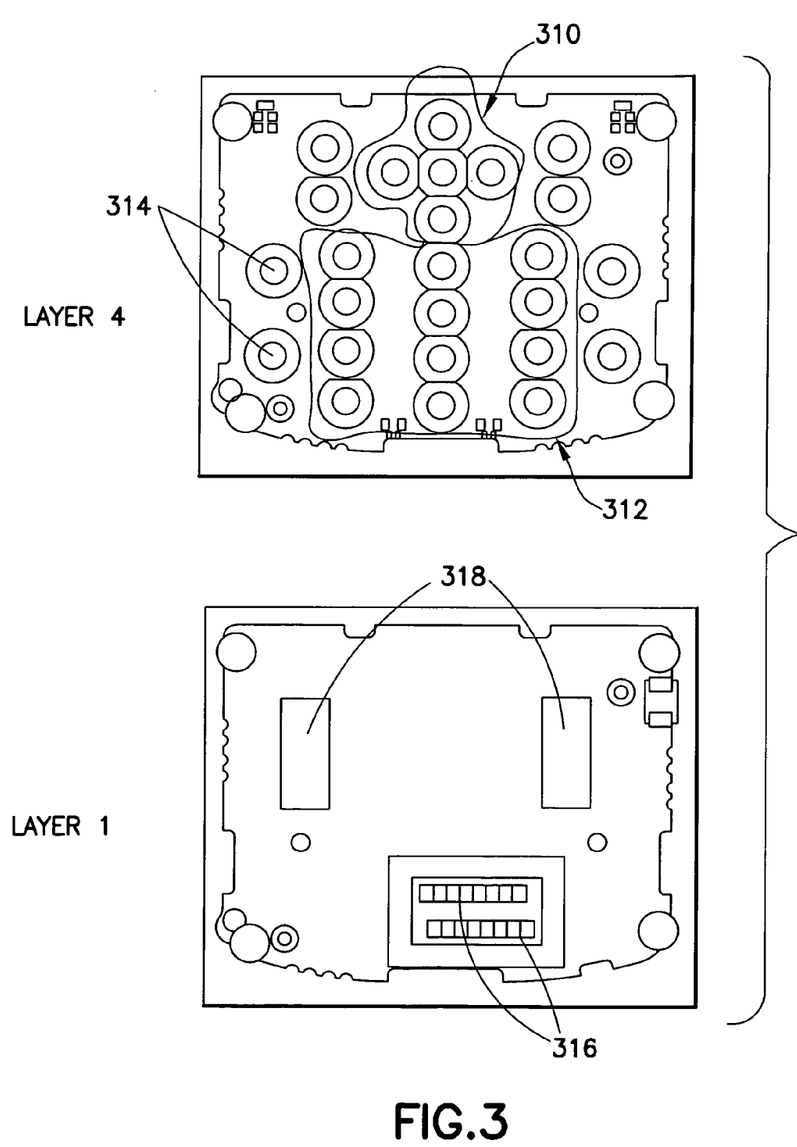
FIG. 3 is a plan view of the two major outboard surfaces of a different PWB using selectively printed carbon ink coatings according to another exemplary embodiment of the invention.

Eliminating the soldermask from both outboard surfaces and instead using selective carbon ink printing on the traces 210 and keypads 214 saves as much as 10% of the manufacture cost for a more extensive PWB layout such as that shown at FIG. 3. The reader may recognize this general PWB layout as tailored to the user interface of a more traditional mobile telephone, with the navigation cluster 310 as detailed above for FIG. 1, a traditional 4×4 array 312 of keypads for numbers 0-9 and symbols # and * on the user interface, and further keypads 314 which may be dedicated keys or soft keys on the user interface. Carbon printing is present at areas 316 for the keypad array on layer 1, areas 318 for surface traces on layer 1, and also selectively over the keypads 312, 314, 316 themselves on layer 4. Cost savings for the more compact PWB of FIG. 2 would be a bit less than the 10% savings these teachings enable for the FIG. 3 layout, but the savings are appreciable nonetheless.

Figure 4A:
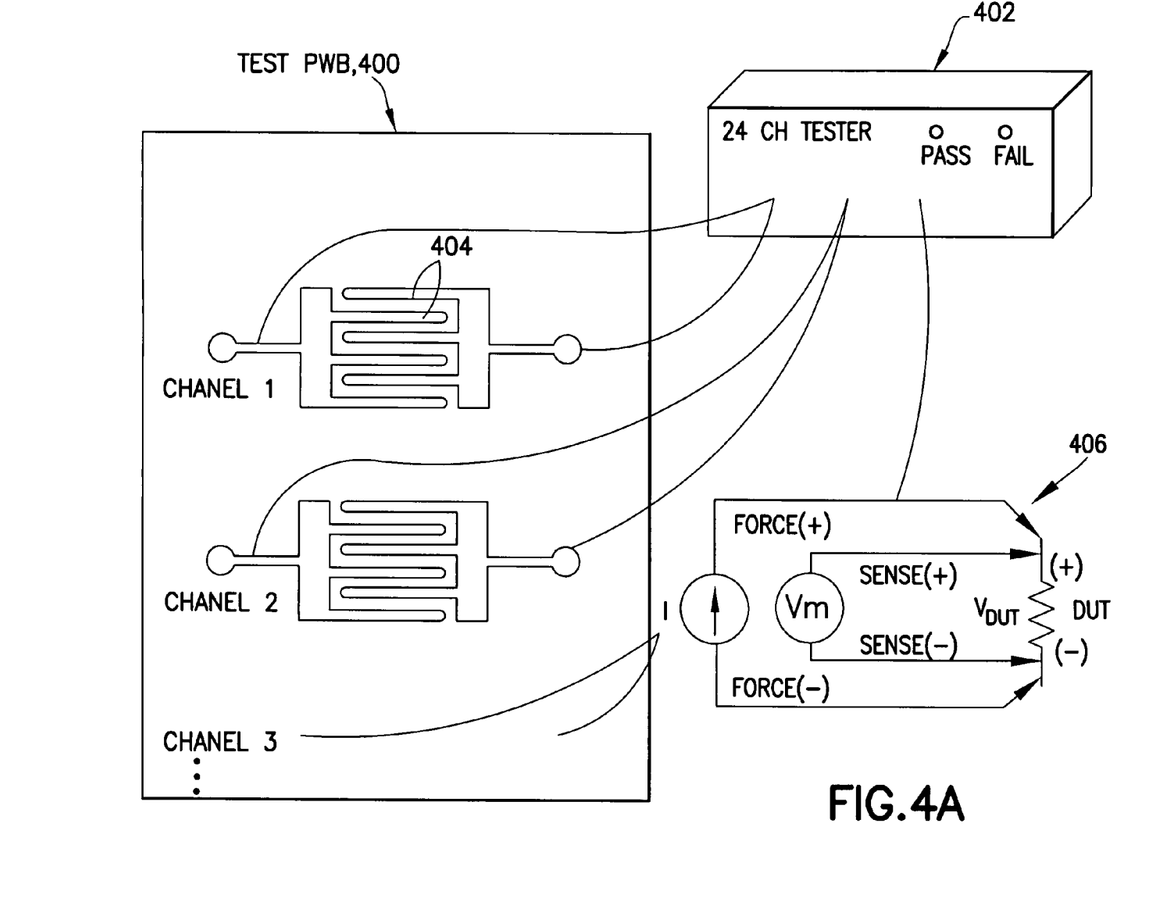
FIGS. 4A-D illustrate a test apparatus and PWB which were used to compare lifetime of a PWB with soldermask outer layers to an exemplary PWB according to these teachings.

FIGS. 4A-G illustrate testing on the embodiment of FIG. 2 as compared to other PWBs. FIG. 4A illustrates the arrangement of a humidity test apparatus and test PWB 400, which was exposed to lead free solder re-flow temperatures prior to the testing. A 24 channel tester 402 asserted a current across closely spaced traces 404 on a surface of the test PWB 400, each coated with a printed carbon ink. A detector 406 using a 4-wire Kelvin testing method measured current through the traces 404, in which DUT in FIG. 4A stands for device under test. In a first test (commonly known as a highly accelerated stress test HAST), humidity was 85% and temperature was 110 degrees C. In a second test (commonly known as the 85/85 test), humidity was 85% also but temperature was 85 degrees C. These are to estimate lifetime of the PWB under humid conditions. Test parameters are detailed in the table below.

|  | HAST | 85/85-test |
| --- | --- | --- |
| Temperature | 110° C. | 85° C. |
| Humidity | 85% | 85% |
| Pressure | atm + 122 kPa | atm + 49.1 kPa |
| Duration | 264 h | 1000 h |
| BIAS Voltage | 5 V | 5 V |

Figure 4B:
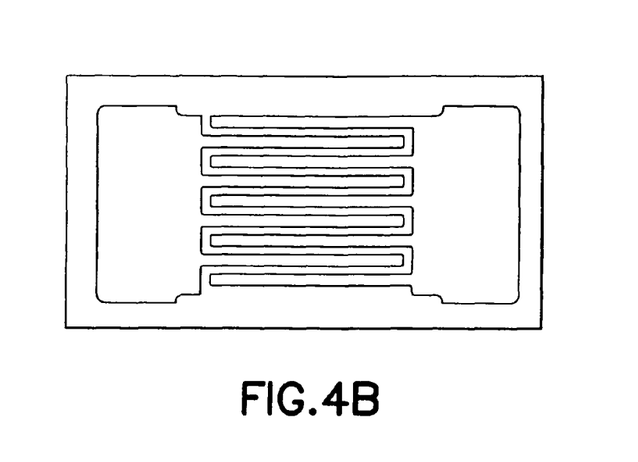
Figure 4C:
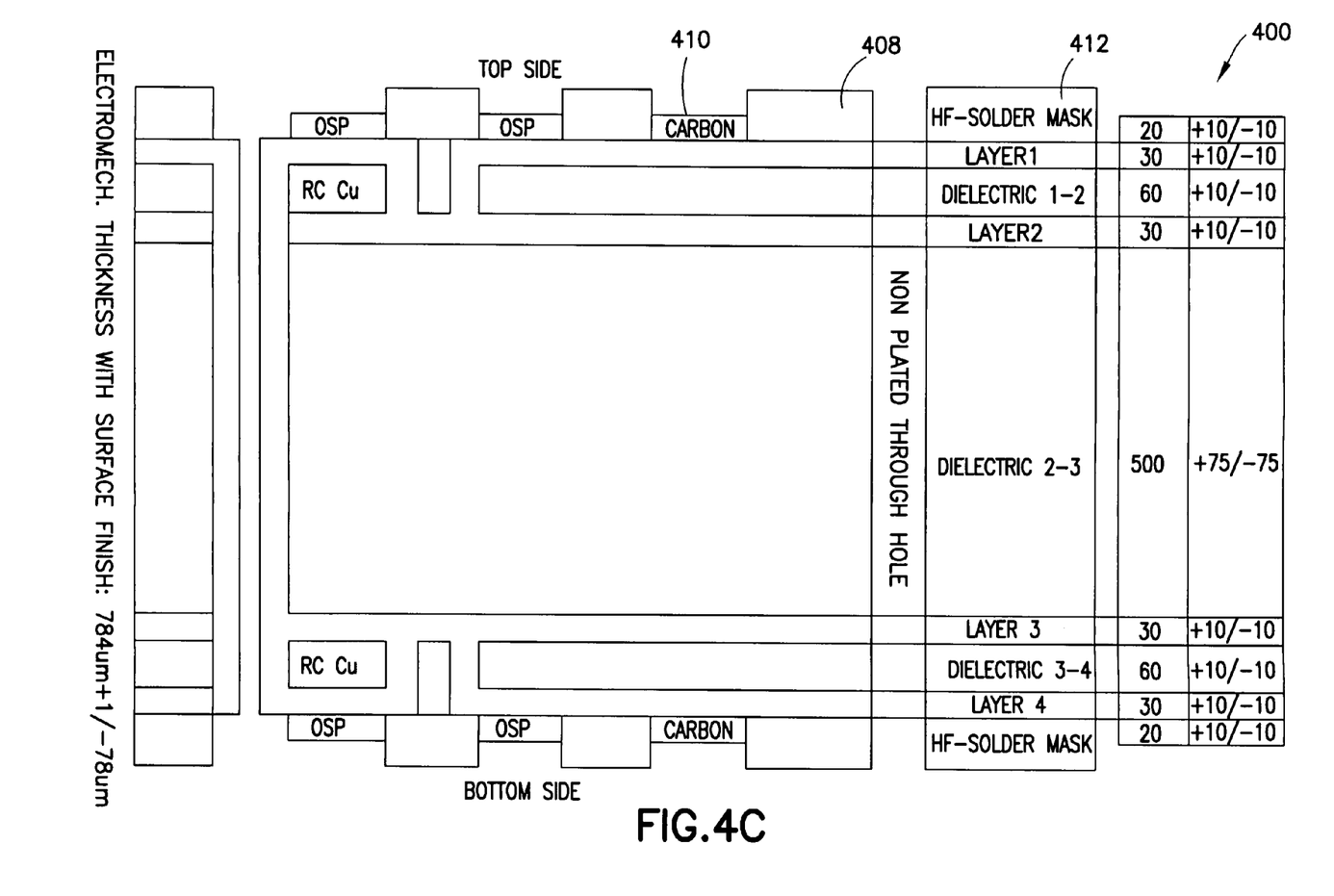

FIG. 4B illustrates with more particularity that the trace used for the tests was a comb pattern. FIG. 4C shows a sectional view of the test PWB 400, which used a soldermask 408 to separate the different comb patterns of which some were printed with a carbon ink 410 as the outermost layer, and some where a soldermask 412 was the outermost layer. As seen at FIG. 4, like FIG. 2 the test PWB is four layers (layers 1, 2 3 and 4 are indicated). Layer 1 is nearest the top side of FIG. 4C and layer 4 is nearest the bottom side. Layers 3 and 4 are isolated from one another by dielectric layer 3-4 as indicated, and layers 1 and 2 are similarly isolated from each other by dielectric layer 1-2 as indicated.

Figure 4D:
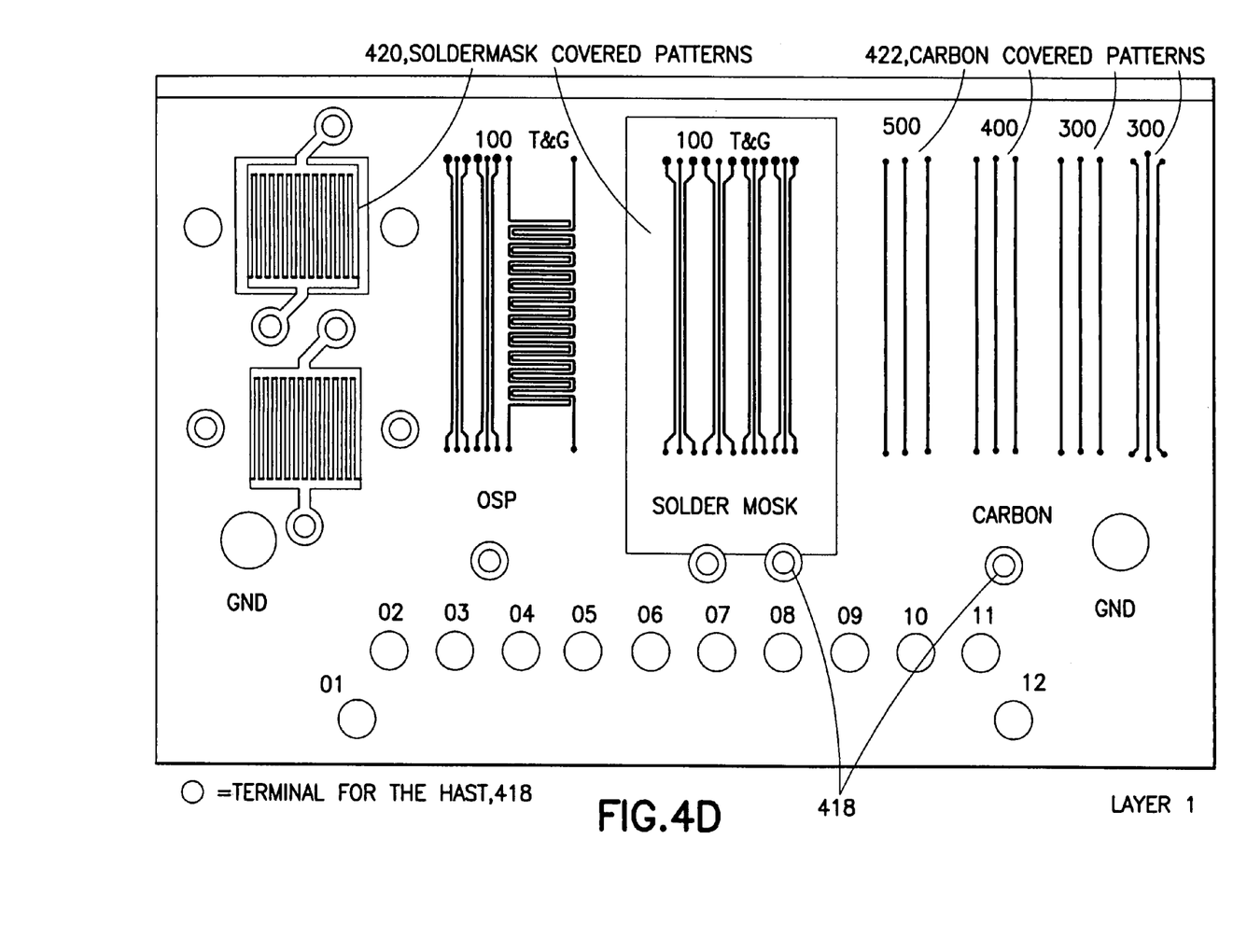

Terminals 418 for the HAST are shown at FIG. 4D which were used to connect combs covered with a soldermask layer (reference number 420) and those covered with a printed carbon ink 422. As further detailed at FIG. 44, there were two different carbon-coated combs of traces under test, one with line spacing of 300 microns and the other with line spacing 400 microns.

Figure 4E:
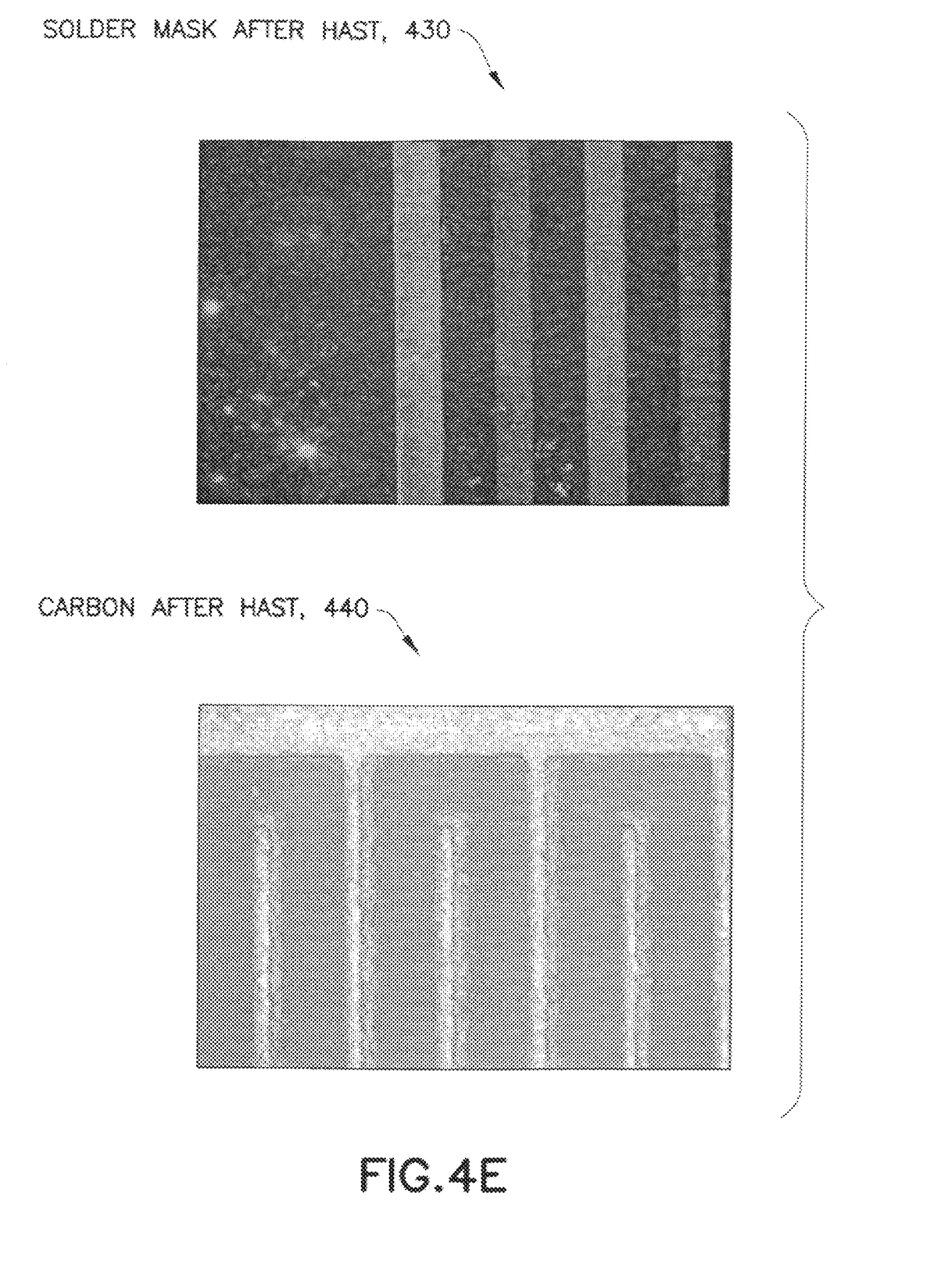
FIG. 4E reproduces micrographs of PWBs tested using the apparatus of FIGS. 4A-D.

Numerical results are not reproduced herein, but a micrograph of the carbon-printed trace 440 is shown at FIG. 4E alongside a micrograph of the soldermask protected comb 430. The HAST continued for 250 hours simulating a lifetime for the test PWB 400, and the carbon coating is seen at FIG. 4E to have provided at least substantially similar protection to the traces on the outboard surfaces of the PWB as the more traditional soldermask, but with the cost savings noted above.

Figure 5:
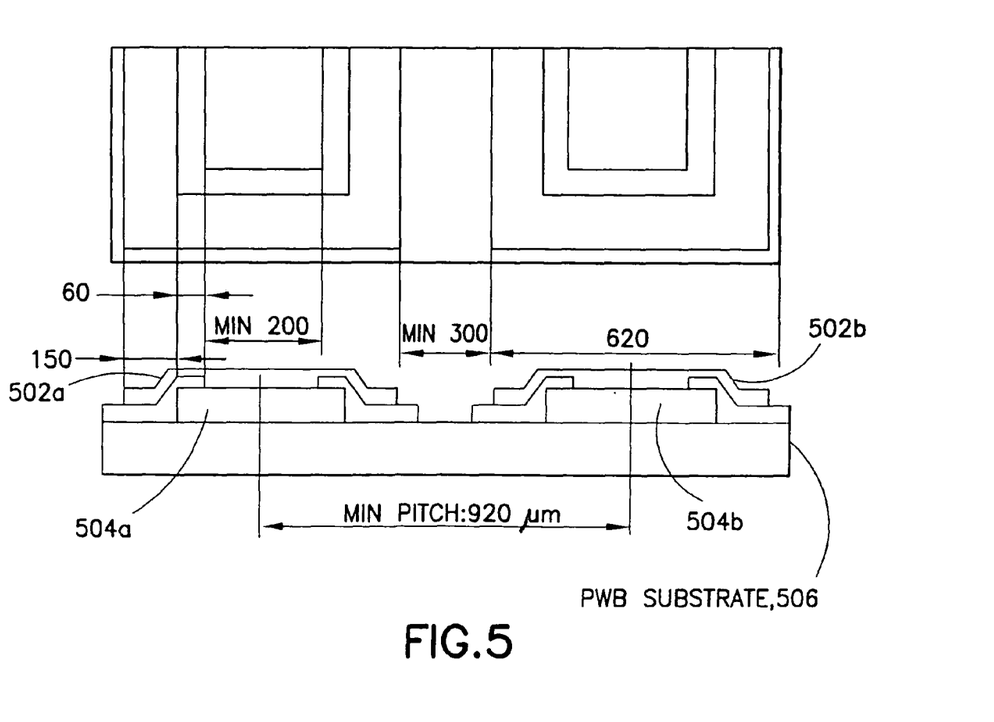
FIG. 5 is a sectional view of a portion of a PWB and one major outboard surface showing spacing between conductors over which screen printed carbon ink is disposed.

From the above humidity testing the inventors conclude that carbon ink as a protective layer over an outboard copper trace is at least as protective of that trace as an overlayer of soldermask. Current state of the art for carbon ink screen printing limits spacing of adjacent copper traces to a minimum of about 600 microns. For a trace of width 620 microns, that yields a minimum pitch between trace centerlines of about 920 microns to support carbon ink coatings as the outermost protective layer over those traces. This is shown at FIG. 5, in which there is a minimum spacing of 300 microns between the carbon ink overlayer 502a, 502b on two adjacent traces 504a, 504b, each of which are themselves 620 microns wide. Finer trace designs would need outerlayer protection from either soldermask, a lithographic printing process (generally too expensive for PWBs), or some improvement to screen print precision as the inventors understand the current state of the screen printing art.

Figure 6:
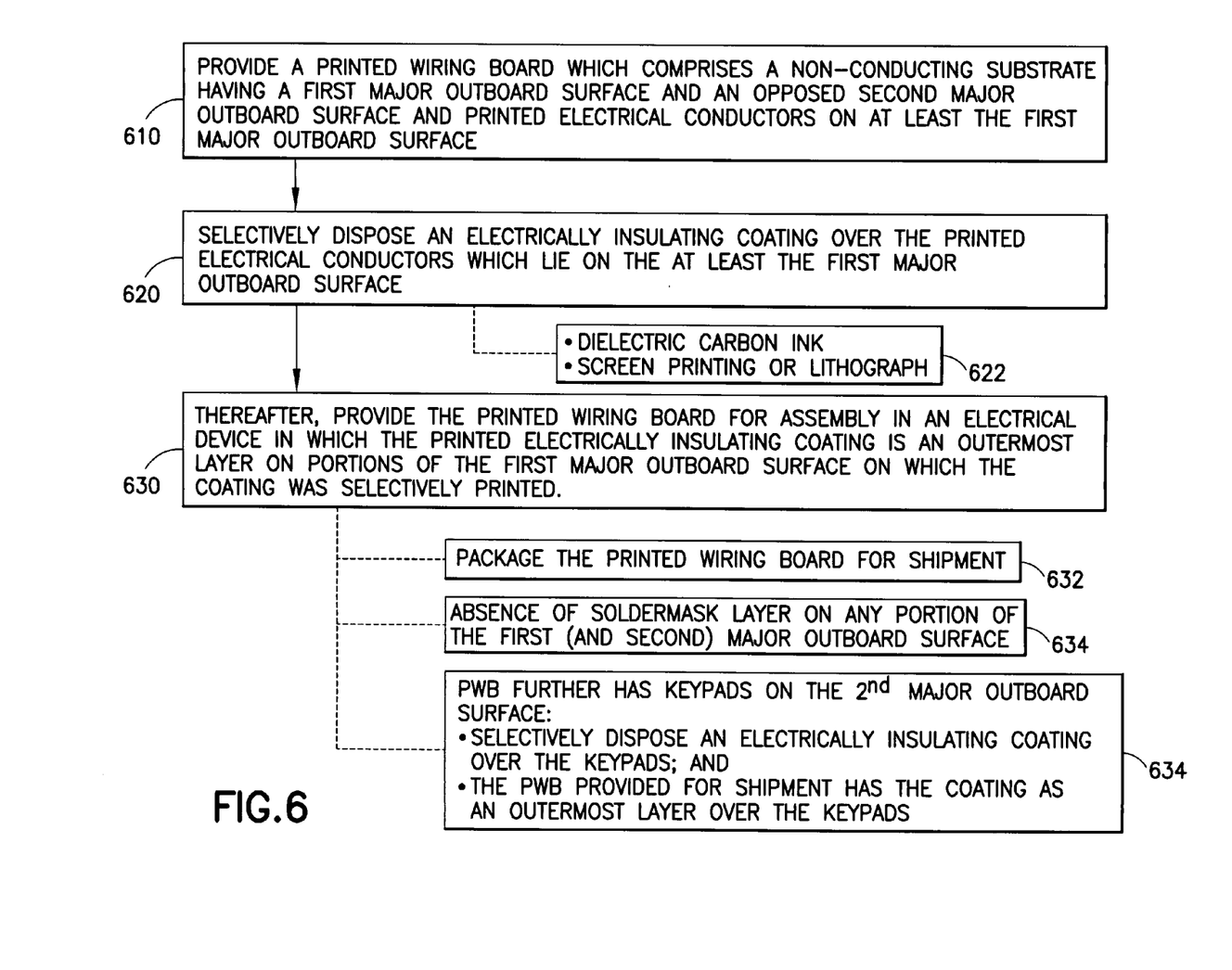
FIG. 6 is a is a logic flow diagram that illustrates the operation of a method, and a result of execution of computer program instructions embodied on a computer readable memory, in accordance with the exemplary embodiments of this invention.

FIG. 6 is a logic flow diagram that illustrates the operation of a method, and a result of execution of computer program instructions that control manufacture of a PWB, in accordance with the exemplary embodiments of this invention as detailed above. At FIG. 6 a method of making a PWB begins at block 610 in which a printed wiring board is provided that comprises a non-conducting substrate (506 of FIG. 5) having a first major outboard surface (201 of FIG. 2) and an opposed second major outboard surface (204 of FIG. 2) and printed electrical conductors (210 of FIG. 2) on at least the first major outboard surface. At block 620 an electrically insulating coating (212 of FIG. 2) is then selectively disposed over the printed electrical conductors which lie on the at least the first major outboard surface without coating the entire first major outboard surface. Further in the method at block 630 the PWB is thereafter provided for assembly in an electrical device in which the finished PWB characterized by the printed electrically insulating coating is an outermost layer on the portion of the first major outboard surface on which it was selectively printed. Such an electrical device is shown below with reference to FIG. 7. In other words, there is an absence of a soldermask layer at least over the printed coating in the completed PWB product, not simply during an interim manufacture step after which a soldermask layer is later applied. The finished PWB may be considered being provided for assembly in an electrical device when it is packaged for shipment to another manufacturer of the electrical device or shipment to a distributor which distributes the finished PWB(s) to that other manufacturer, as shown at block 632.

The PWB may be considered as completed and ready for assembly into an electrical device by electrically connecting a contact on the first major outboard surface to at least one separate component, without penetrating a soldermask layer. This may take place at the PWB manufacturer or at a manufacturer of the larger electrical device of which the PWB becomes a part, but this step is clearly on the fully complete PWB. Preferably there is no soldermask layer on any portion of the first major outboard surface after fabrication of the PWB is completed, which is indicated by the above electrical connection to another separate component or components. In this manner the printed electrically insulating coating is the outermost layer over the printed electrical conductors which lie on the first major outboard surface for the finished PWB.

In various specific embodiments further detailed above, of which embodiments may be employed singularly or in any combination for the above PWB method, the electrically insulating coating is a dielectric carbon ink as shown at block 622; the carbon ink is printed via screen printing or lithographic printing also as shown at block 622; at block 634 it is shown the embodiment in which the PWB further includes keypads (214 of FIG. 2) on the second major surface and the method further includes selectively applying a coating to the keypads on the second major outboard surface which is also characterized by the absence of a soldermask over the coating which overlies the keypads. As above, preferably there is no soldermask on any portion of either the first or the second major outboard surfaces of the finished PWB as shown at block 634. In further embodiments the coating is selectively applied over electrical conductors and keypads which are spaced from one another by a minimum of about 300 microns (see FIG. 5); and the provided PWB includes inter-layers of electrical conductors (layers 2 and 3 of FIG. 2, also shown at FIG. 4C) which are isolated from those on the first major surface (and from the keypads) via intervening dielectric layers (dielectric 1-2 and dielectric 3-4 at FIG. 4).

Now is described with reference to FIG. 7 a mobile radiotelephone which is an exemplary electrical device into which the finished PWB detailed above may be disposed. Other exemplary electrical devices include user equipments UEs, cellular telephones, personal digital assistants (PDAs) with or without wireless communication capabilities, portable computers with or without wireless communication capabilities, digital cameras, gaming devices, music storage and playback appliances, Internet appliances permitting wireless Internet access and browsing, and other portable units or terminals that incorporate combinations of such functions. A PWB according to these teachings may also be assembled into a non-portable device such as a desktop computer station and/desktop graphical display module, for example.

Figure 7:
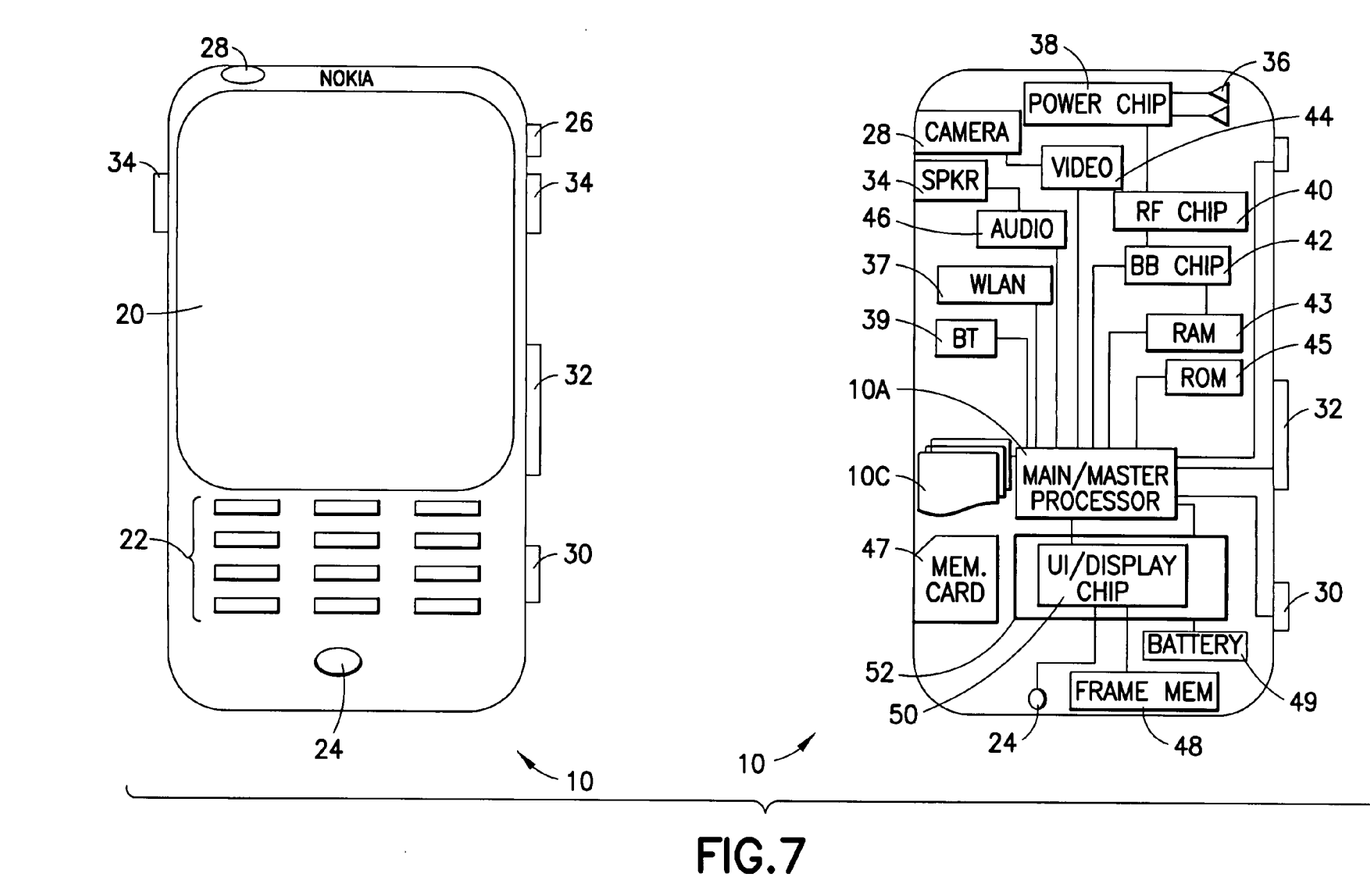
FIG. 7 is a plan view and a sectional view of an electrical device in which the exemplary PWB of FIG. 2 is disposed and connected to other components.

FIG. 7 illustrates detail of an exemplary radiotelephone/UE in both plan view (left) and sectional view (right), and the invention may be embodied in one or some combination of those more function-specific components. At FIG. 7 the UE 10 has a graphical display interface 20 and a user interface 22 illustrated as a keypad but understood as also encompassing touch-screen technology at the graphical display interface 20 and voice-recognition technology received at the microphone 24. The keypad at the left of FIG. 7 provides the user inputs to the keypad cluster (e.g., similar to reference number 312 of FIG. 3) on the outboard surface (204 of FIG. 2) of the PWB as detailed above. A power actuator 26 controls the device being turned on and off by the user. The exemplary UE 10 may have a camera 28 which is shown as being forward facing (e.g., for video calls) but may alternatively or additionally be rearward facing (e.g., for capturing images and video for local storage). The camera 28 is controlled by a shutter actuator 30 and optionally by a zoom actuator 32 which may alternatively function as a volume adjustment for the speaker(s) 34 when the camera 28 is not in an active mode.

Within the sectional view of FIG. 7 are seen multiple transmit/receive antennas 36 that are typically used for cellular communication. The antennas 36 may be multi-band for use with other radios in the UE. The operable ground plane for the antennas 36 is shown by shading as spanning the entire space enclosed by the UE housing though in some embodiments the ground plane may be limited to a smaller area, such as disposed on a printed wiring board on which the power chip 38 is formed. The power chip 38 controls power amplification on the channels being transmitted and/or across the antennas that transmit simultaneously where spatial diversity is used, and amplifies the received signals. The power chip 38 outputs the amplified received signal to the radio-frequency (RF) chip 40 which demodulates and downconverts the signal for baseband processing. The baseband (BB) chip 42 detects the signal which is then converted to a bit-stream and finally decoded. Similar processing occurs in reverse for signals generated in the apparatus 10 and transmitted from it.

Signals to and from the camera 28 pass through an image/video processor 44 which encodes and decodes the various image frames. A separate audio processor 46 may also be present controlling signals to and from the speakers 34 and the microphone 24. The graphical display interface 20 is refreshed from a frame memory 48 as controlled by a user interface chip 50 which may process signals to and from the display interface 20 and/or additionally process user inputs from the keypad 22 and elsewhere.

Certain embodiments of the UE 10 may also include one or more secondary radios such as a wireless local area network radio WLAN 37 and a Bluetooth® radio 39, which may incorporate an antenna on-chip or be coupled to an off-chip antenna. Throughout the apparatus are various memories such as random access memory RAM 43, read only memory ROM 45, and in some embodiments removable memory such as the illustrated memory card 47 on which the various programs 10C are stored. All of these components within the UE 10 are normally powered by a portable power supply such as a battery 49.

The aforesaid processors 38, 40, 42, 44, 46, 50, if embodied as separate entities in a UE 10, may operate in a slave relationship to the main processor 10A which may then be in a master relationship to them. Embodiments of this invention may be deployed in various locations within the UE 10, but is shown specifically associated with the user input/display chip 50 as a PWB 52 interconnecting that chip 50 with the user's keypad 22. It is noted that other embodiments of the PWB 52 may be disposed elsewhere in the UE 10 and electrically coupled to any other one or multiple ones of the other various chips and memories as shown or to another processor that combines some of the functions described above for FIG. 7.

Note that the various chips (e.g., 38,40,42, etc.) that were described above may be combined into a fewer number than described and, in a most compact case, may all be embodied physically within a single chip.

The various blocks shown in FIG. 6 may be viewed as method steps, and/or as operations that result from operation of computer program code, and/or as a plurality of coupled logic circuit elements constructed to carry out the associated function(s) for manufacturing a PWB according to these teachings.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. An apparatus comprising:
   a non-conducting substrate having a first major outboard surface and a second major outboard surface opposite to the first major outboard surface;
   electrical conductors over at least the first major outboard surface, at least two electrical conductors of the electrical conductors being adjacent to each other; and
   an electrically insulating coating formed of a dielectric ink selectively disposed over the electrical conductors such that the coating forms an outermost layer over the electrical conductors of the first major outboard surface, where at least one area between the at least two electrical conductors adjacent to each other is free of the dielectric ink, the electrically insulating coating protecting the electrical conductors from corrosion, wherein the electrically insulating coating is disposed over less than an entire first major outboard surface.

2. The apparatus of claim 1, wherein the apparatus comprises a printed wiring board and the dielectric ink comprises a dielectric carbon ink.

3. The apparatus according to claim 1, wherein there is an absence of a soldermask layer on any portion of the first major outboard surface.

4. The apparatus according to claim 1, further comprising:
   keypads on the second major surface; and
   an electrically insulating coating comprising the dielectric ink selectively disposed over the keypads such that the coating over the keypads forms an outermost layer over less than an entirety of the second major outboard surface.

5. The apparatus according to claim 4, wherein there is an absence of a soldermask layer on any portion of the second major outboard surface.

6. The apparatus according to claim 1, in which all adjacent ones of the electrical conductors over which the electrically insulating coating is disposed are spaced edge to edge from one another by a minimum of about three hundred microns.

7. The apparatus according to claim 1, further comprising: at least one inter-layer of electrical conductors which are isolated from the said electrical conductors over the first major surface by an intervening dielectric layer.

8. The apparatus according to claim 1, disposed within an electrical device and having a wired electrical connection between the first major outboard surface of the apparatus and a separate component of the electrical device, where there is an absence of a soldermask on the first and the second major outboard surfaces.

9. An apparatus comprising:
   a non-conducting substrate having a first major outboard surface and a second major outboard surface opposite to the first major outboard surface;
   a plurality of conductive means comprising electrical conductors disposed over at least the first major outboard surface, at least two electrical conductors of the plurality of conductive means being adjacent to each other; and
   electrically insulating coating means formed of a dielectric ink selectively disposed over the conductive means such that the electrically insulating coating means forms an outermost layer over the electrical conductors of the first major outboard surface, where at least one area between the at least two electrical conductors adjacent to each other is free of the dielectric ink, the electrically insulating coating means protecting the electrical conductors from corrosion, wherein the electrically insulating coating means is disposed over less than an entire first major outboard surface.

10. The apparatus according to claim 9, disposed within an electrical device and having a wired electrical connection between the first major outboard surface of the apparatus and a separate component of the electrical device, in which there is an absence of a soldermask on the first second major outboard surface and the second major outboard surface;
    and wherein the plurality of conductive means comprises a plurality of printed copper traces, and wherein the electrically insulating means comprises a printed dielectric carbon ink.

11. A method, comprising:
    providing a printed wiring board which comprises a non-conducting substrate having a first major outboard surface and a second major outboard surface opposite to the first major outboard surface, and electrical conductors on at least the first major outboard surface, at least two electrical conductors of the electrical conductors being adjacent to each other;
    selectively disposing an electrically insulating coating in the form of a dielectric ink over the electrical conductors which lie on the at least the first major outboard surface, where at least one area between the at least two electrical conductors adjacent to each other is free of the dielectric ink; and thereafter
    providing the printed wiring board for assembly in an electrical device in which the electrically insulating coating is an outermost layer on portions of the first major outboard surface on which the coating was selectively printed, the electrically insulating coating protecting the electrical conductors from corrosion, wherein the electrically insulating coating is disposed over less than an entire first major outboard surface.

12. The method according to claim 11, wherein providing the printed wiring board for assembly comprises packaging the printed wiring board for shipment to a manufacturer of the electrical device or for shipment to a distributor of printed wiring boards.

13. The method according to claim 11, wherein the printed wiring board which is provided for assembly in an electrical device where there is an absence of a soldermask layer on any portion of the first major outboard surface.

14. The method according to claim 11, wherein the comprises a dielectric carbon ink.

15. The method according to claim 11, wherein selectively disposing the electrically insulating coating comprises one of screen printing or lithographic printing.

16. The method according to claim 11, in which the provided printed wiring board further comprises keypads on the second major surface and the method further comprises:
   selectively disposing an electrically insulating coating comprising dielectric ink over the keypads;
and further the electrically insulating coating is an outermost layer over the keypads for the printed wiring board which is provided for assembly in an electrical device.

17. The method according to claim 16, wherein the printed wiring board which is provided for assembly in an electrical device wherein there is an absence of a soldermask layer on any portion of the second major outboard surface.

18. The method according to claim 11, in which all adjacent ones of the electrical conductors over which the electrically insulating coating is selectively applied are spaced from one another by a minimum of about three hundred microns.

19. The method according to claim 11, in which the provided printed wiring board further comprises at least one inter-layer of electrical conductors which are isolated from the said electrical conductors on the first major surface by an intervening dielectric layer.

20. The method according to claim 14, wherein the electrical conductors are copper electrical conductors.

\* \* \* \* \*